(12) United States Patent
Yu et al.

(10) Patent No.: US 10,520,654 B2
(45) Date of Patent: Dec. 31, 2019

(54) ULTRA-THIN BROADBAND RETARDATION FILM

(71) Applicant: imat corporation, Hsinchu (TW)

(72) Inventors: Tsai-An Yu, Hsinchu County (TW); Da-Ren Chiou, Taoyuan (TW); Shih-Ming Hung, Hsinchu (TW); Peng-Shun Tsai, Hsinchu County (TW); Yi-Ting Chiu, Hsinchu County (TW); Kuo-Chen Wu, Hsinchu (TW); Yi-Chien Chen, Hsinchu County (TW)

(73) Assignee: imat corporation, Hsinchu (TW)

( * ) Notice: Subject to any disclaimer, the term of this patent is extended or adjusted under 35 U.S.C. 154(b) by 92 days.

(21) Appl. No.: 15/648,476

(22) Filed: Jul. 13, 2017

(65) Prior Publication Data

US 2018/0017723 A1    Jan. 18, 2018

(30) Foreign Application Priority Data

Jul. 13, 2016  (TW) .............................. 105122014 A

(51) Int. Cl.
*G02B 5/30*        (2006.01)
*G02F 1/13363*     (2006.01)
*H01L 51/52*       (2006.01)

(52) U.S. Cl.
CPC .......... *G02B 5/3016* (2013.01); *G02B 5/3083* (2013.01); *G02F 1/13363* (2013.01); *G02F 2413/02* (2013.01); *G02F 2413/14* (2013.01); *H01L 51/5281* (2013.01)

(58) Field of Classification Search
CPC ........... G02F 1/13363; G02F 1/133632; G02F 2413/02; G02F 2413/14; G02F 2001/133633; G02B 5/3016; G02B 5/3083
See application file for complete search history.

(56) References Cited

U.S. PATENT DOCUMENTS

| 8,416,376 | B2 | 4/2013 | Palto | |
|---|---|---|---|---|
| 2005/0195346 | A1* | 9/2005 | Maeda | G02F 1/133371 349/114 |
| 2005/0200776 | A1* | 9/2005 | Hara | G02B 5/3041 349/98 |
| 2017/0158793 | A1* | 6/2017 | Endo | C08F 220/30 |
| 2017/0276850 | A1* | 9/2017 | Oosato | G02F 1/13363 |

FOREIGN PATENT DOCUMENTS

| CN | 104536204 | 4/2015 |
|---|---|---|
| TW | 201120491 | 6/2011 |
| TW | 201207450 | 2/2012 |
| TW | 201326968 | 7/2013 |

\* cited by examiner

*Primary Examiner* — Angela K Davison
(74) *Attorney, Agent, or Firm* — JCIPRNET

(57) ABSTRACT

An ultra-thin broadband retardation film is provided. The broadband retardation film includes a first retardation film and a second retardation film. The second retardation film is disposed on a side of the first retardation film, wherein an in-plane retardation value Ro of the first retardation film is between 70 nm and 130 nm, an in-plane retardation value Ro of the second retardation film is between 140 nm and 260 nm, and an angle between an optic axis of the first retardation film and an optic axis of the second retardation film is between 35° and 70°.

2 Claims, 2 Drawing Sheets

------- ideal wavelength dispersion
----- prior retardation film
——— ultra-thin broadband retardation film according to Embodiment 1 of the invention ——— ultra-thin broadband retardation film according to Embodiment 2 of the invention
----- ultra-thin broadband retardation film according to Embodiment 3 of the invention

ULTRA-THIN BROADBAND RETARDATION FILM

CROSS-REFERENCE TO RELATED APPLICATION

This application claims the priority benefit of Taiwan application serial no. 105122014, filed on Jul. 13, 2016. The entirety of the above-mentioned patent application is hereby incorporated by reference herein and made a part of this specification.

BACKGROUND OF THE INVENTION

Field of the Invention

This invention relates to a retardation film, and particularly to an ultra-thin broadband retardation film.

Description of Related Art

A retardation film is often used to produce a phase difference of polarized light in optical displays and to improve the display efficiency of the optical displays. For instance, in organic light-emitting diode (OLED) displays, the metal electrode easily reflects a natural light from the environment and decreases the contrast of the images from organic light-emitting diode displays, so a circular polarizing plate formed by a linear polarizing plate and a retardation film is often laminated on a light emitting face to produce a phase difference of the reflected natural light so that the natural light cannot emit from the light emitting face, and thereby solves the problem of the reflection of natural light from the environment. However, a prior retardation film often can only produce ideal phase difference for a single wavelength, and the prior retardation film often has a characteristic of positive wavelength dispersion, and these characteristics significantly limit the application of the prior retardation film. Current products of the retardation film having a negative wavelength dispersion property includes a single-sheet type by Teijin Company and double-sheet type by Nitto Denko Corp. and by Sumitomo Company, but these are made from a material such as a polycarbonate or a cyclo olefin polymer, etc., by a stretching method and are rather thick, thus have a limited application under the trend of slimness, and also these products cannot be directly laminated with a polarizer in a roll-to-roll manner. As a result, to develop an ultra-thin broadband retardation film that can be laminated with a polarizer in a roll-to-roll manner and has a negative wavelength dispersion property is one of the current goals for persons skilled in the art to achieve.

SUMMARY OF THE INVENTION

The invention provides an ultra-thin broadband retardation film having a negative wavelength dispersion property.

The ultra-thin broadband retardation film of the invention includes a first retardation film and a second retardation film. The second retardation film is disposed on a side of the first retardation film, wherein an in-plane retardation value Ro of the first retardation film is between 70 nm and 130 nm, an in-plane retardation value Ro of the second retardation film is between 140 nm and 260 nm, and an angle between an optic axis of the first retardation film and an optic axis of the second retardation film is between 35° and 70°.

According to an embodiment of the invention, a material of the first retardation film and a material of the second retardation film respectively include a discotic liquid crystal, a rod-like liquid crystal, or a rod-like liquid crystal doped with a chiral molecule, wherein the chiral molecule is added by 0.01-3% of a solid content.

According to an embodiment of the invention, the first retardation film and the second retardation film respectively have a thickness of greater than 0 μm and less than or equal to 5 μm.

According to an embodiment of the invention, the ultra-thin broadband retardation film further includes an adhesive layer, disposed between the first retardation film and the second retardation film.

Based on the above, in the ultra-thin broadband retardation film of the invention, as the in-plane retardation value Ro of the first retardation film is between 70 nm and 130 nm, the in-plane retardation value Ro of the second retardation film is between 140 nm and 260 nm, and the angle between the optic axis of the first retardation film and the optic axis of the second retardation film is between 35° and 70°, the ultra-thin broadband retardation film has a negative wavelength dispersion property.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

In the present disclosure, the range stated in a form of "from a value to another value" is a schematic representation to avoid listing all values within the value range in the specification. As a result, a certain value range stated in the form of "from a value to another value" includes any value within the certain value range and any smaller value range defined by any values within the certain value range, and is considered equivalent to the any value or the any smaller value range in the specification.

The invention provides an ultra-thin broadband retardation film having a negative wavelength dispersion property. An embodiment is provided as follows with reference to FIG. 1 as an example showing how the invention may be realized.

Figure 1:
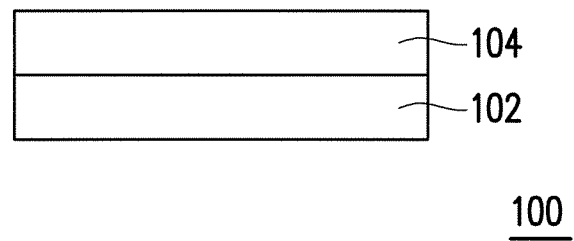
FIG. 1 is a schematic cross-sectional view of an ultra-thin broadband retardation film according to an embodiment of the invention.

FIG. 1 is a schematic cross-sectional view of an ultra-thin broadband retardation film according to an embodiment of the invention. Please refer to FIG. 1. An ultra-thin broadband retardation film 100 includes a first retardation film 102 and a second retardation film 104. The second retardation film 104 is disposed on a side of the first retardation film 102, wherein an in-plane retardation value Ro of the first retardation film 102 is between 70 nm and 130 nm, an in-plane retardation value Ro of the second retardation film 104 is between 140 nm and 260 nm, and an angle between an optic axis of the first retardation film 102 and an optic axis of the second retardation film 104 is between 35° and 70°. In this embodiment, the optic axis of the first retardation film 102 and the optic axis of the second retardation film 104 are slow axes.

In detail, by combining the first retardation film 102 and the second retardation film 104, each having the in-plane retardation value Ro within the ranges and having the angle between the optic axes within the range, the ultra-thin broadband retardation film 100 formed thereby has a negative wavelength dispersion property. In other words, the ultra-thin broadband retardation film 100 has a property that the longer a wavelength is, the larger a retardation value of the ultra-thin broadband retardation film 100 is. Accordingly, compared with a prior retardation film, the ultra-thin broadband retardation film 100 has an excellent optical property in all visible light wavelength ranges.

Then, detailed descriptions of the ultra-thin broadband retardation film 100 according to Embodiment 1 of the invention and the prior retardation film are provided as follows with reference to FIG. 2.

Figure 2:
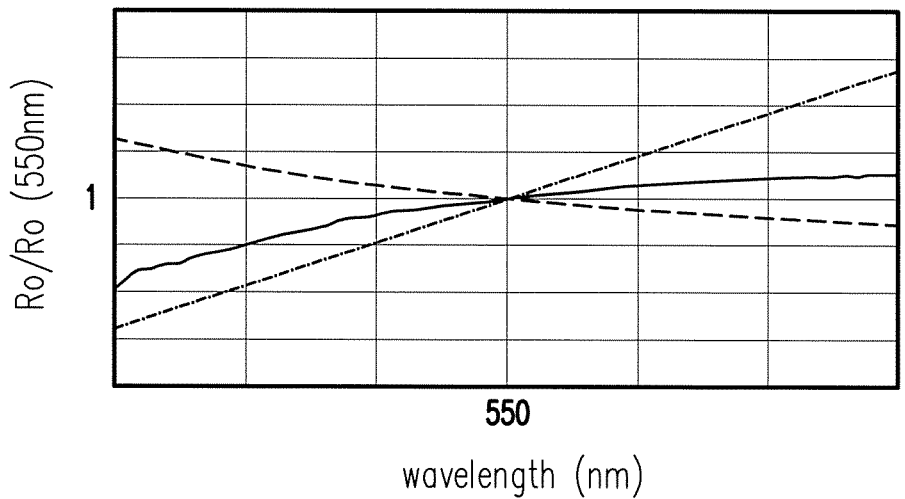
FIG. 2 is a curve diagram of a wavelength dispersion relation between an ultra-thin broadband retardation film according to Embodiment 1 of the invention and a prior retardation film.

FIG. 2 is a curve diagram of a wavelength dispersion relation between the ultra-thin broadband retardation film according to Embodiment 1 of the invention and the prior retardation film. Please refer to FIG. 2, wherein the horizontal axis is the wavelength, and the vertical axis is a wavelength dispersion of a linear retardance value Ro obtained after normalizing the in-plane retardation value Ro on the wavelength of 550 nm (i.e. $Ro/Ro_{(550)}$ (nm)). The first retardation film 102 included in the ultra-thin broadband retardation film 100 according to Embodiment 1 of the invention has an in-plane retardation value Ro of 130 nm, the second retardation film 104 included in the ultra-thin broadband retardation film 100 according to Embodiment 1 of the invention has an in-plane retardation value Ro of 260 nm, and the angle between the optic axis of the first retardation film 102 and the optic axis of the second retardation film 104 is 58°. The prior retardation film is the retardation film of type GR125 produced by Teijin Company. Besides, an ideal wavelength dispersion (i.e. an ideal dispersion) is also shown in FIG. 2.

As shown in FIG. 2, both the prior retardation film and the ultra-thin broadband retardation film 100 according to Embodiment 1 of the invention satisfy the expected linear retardance value Ro on the wavelength of approximately 550 nm. However, the linear retardance value Ro of the prior retardation film reduces as the wavelength increases (i.e. the positive wavelength dispersion property), exhibiting a different tendency from the ideal wavelength dispersion and the prior retardation film from endowing an expected phase difference property to the other wavelengths in the visible light wavelength ranges is difficult. In contrast, since the ultra-thin broadband retardation film 100 according to Embodiment 1 of the invention has a negative wavelength dispersion property, which is similar to a tendency of the ideal wavelength dispersion, compared to the prior retardation film, the ultra-thin broadband retardation film 100 can endow an excellent phase difference property to the other wavelengths within the visible light wavelength ranges.

In response to different application needs in practice, an optical property of the ultra-thin broadband retardation film 100 may be adjusted by adjusting the in-plane retardation value Ro of the first retardation film 102, the in-plane retardation value Ro of the second retardation film 104, and the angle between the optic axes of the first retardation film 102 and the second retardation film 104, by which the applicability of the ultra-thin broadband retardation film 100 is increased. Detailed descriptions of ultra-thin broadband retardation films 100 according to Embodiment 2 and Embodiment 3 of the invention are provided as follows with reference to FIG. 3.

Figure 3:
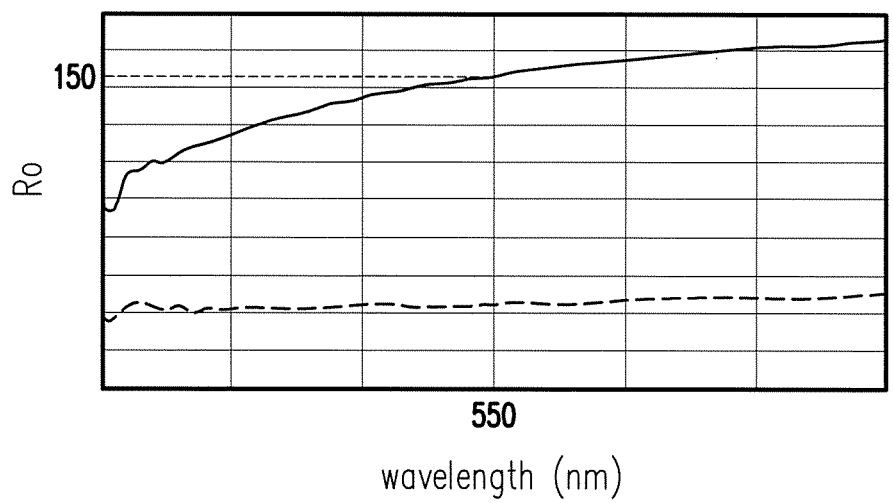
FIG. 3 is a curve diagram of a wavelength dispersion relation between an ultra-thin broadband retardation film according to Embodiment 2 of the invention and an ultra-thin broadband retardation film according to Embodiment 3 of the invention.

FIG. 3 is a curve diagram of a wavelength dispersion relation between the ultra-thin broadband retardation film according to Embodiment 2 of the invention and the ultra-thin broadband retardation film according to Embodiment 3 of the invention, wherein the horizontal axis is the wavelength, and the vertical axis is the wavelength dispersion of the linear retardance value Ro.

According to Embodiment 2 of the invention, the in-plane retardation value Ro of the first retardation film 102 included in the ultra-thin broadband retardation film 100 is 130 nm, the in-plane retardation value Ro of the second retardation film 104 included in the ultra-thin broadband retardation film 100 is 260 nm, and the angle between the optic axis of the first retardation film 102 and the optic axis of the second retardation film 104 is 35°; and according to Embodiment 3 of the invention, the in-plane retardation value Ro of the first retardation film 102 included in the ultra-thin broadband retardation film 100 is 130 nm, the in-plane retardation value Ro of the second retardation film 104 included in the ultra-thin broadband retardation film 100 is 260 nm, and the angle between the optic axis of the first retardation film 102 and the optic axis of the second retardation film 104 is 60°.

As shown in FIG. 3, the greater the angle between the optic axes of the first retardation film 102 and the second retardation film 104 is, the smaller the linear retardance value Ro of the ultra-thin broadband retardation film 100 is and the smaller a curve slope according to the curve diagram of the wavelength dispersion relation is.

In addition to the property regarding the relation between the angle between the optic axes of the first retardation film 102 and the second retardation film 104 and the linear retardance value Ro, the ultra-thin broadband retardation film 100 according to the invention further has two properties as follows: the greater the in-plane retardation value Ro of the first retardation film 102 is, the smaller the linear retardance value Ro of the ultra-thin broadband retardation film 100 is within a blue light wavelength range (i.e. the greater the curve slope according to the curve diagram of the wavelength dispersion relation is within the blue light wavelength range), and the greater the in-plane retardation value Ro of the second retardation film 104 is, the greater the linear retardance value Ro of the ultra-thin broadband retardation film 100 is.

A material of the first retardation film 102 and a material of the second retardation film 104 respectively include a discotic liquid crystal, a rod-like liquid crystal, or a rod-like liquid crystal doped with a chiral molecule, wherein the amount of the chiral molecule is added by 0.01-3% of the solid content. According to an embodiment of the invention, the material of the first retardation film 102 and the material of the second retardation film 104 are, for example, a rod-like liquid crystal of type LC1057 or type LC242 produced by BASF company. According to another embodiment of the invention, the material of the first retardation film 102 and the material of the second retardation film 104 are, for example, a rod-like liquid crystal of type LC1057 produced by BASF Company doped with a chiral molecule of type LC756 produced by BASF Company, or a rod-like liquid crystal of type LC242 produced by BASF Company doped with a chiral molecules of type LC756 produced by BASF Company.

Since the first retardation film 102 and the second retardation film 104 may be formed by a rod-like liquid crystal or a discotic liquid crystal, both the first retardation film 102 and the second retardation film 104 may be produced by a roll-to-roll process, so as to increase the productivity of the ultra-thin broadband retardation film 100. In detail, a method of producing the first retardation film 102 and the second retardation film 104 includes, for example, the following. First, a substrate is wound out from a winding roller of the substrate. Then, an alignment treatment is performed on the substrate, which is, for example, a rubbing-alignment method, a photo-alignment method, or any alignment method commonly known to persons having ordinary skill in the art. Then, a liquid crystal material is coated on the substrate and then drying and UV curing of the liquid crystal material is performed.

Since an optic axis direction of the liquid crystal material may be easily adjusted by performing the alignment treatment, when adjustment of the angle between the optic axis of the first retardation film 102 and the optic axis of the second retardation film 104 is required in response to different application needs in practice as mentioned above, the first retardation film 102 and the second retardation film 104 having a desired optic axis direction may still be obtained by the roll-to-roll process. As a result, compared to the prior retardation film, the productivity and applicability of the ultra-thin broadband retardation film 100 increase significantly.

Since the material of the first retardation film 102 and the material of the second retardation film 104 may be a rod-like liquid crystal doped with a chiral molecule, both the first retardation film 102 and the second retardation film 104 may self-adjust to obtain a required optic axis angle by the material property and the alignment treatment.

In this embodiment, the first retardation film 102 and the second retardation film 104 respectively have a thickness of greater than 0 μm and less than or equal to 5 μm. Accordingly, the ultra-thin broadband retardation film 100 is thinner than the prior retardation film having a thickness of approximately 50 μm or above, and satisfies the slimness requirement in the application of optical displays.

In this embodiment, the ultra-thin broadband retardation film 100 may optionally include an adhesive layer disposed between the first retardation film 102 and the second retardation film 104 (the adhesive layer is not shown in the figures). A material of the adhesive layer is not particularly limited and may be, for example, an ultraviolet ray (UV) adhesive, a pressure sensitive adhesive (PSA), or an optically clear adhesive (OCA). In addition, the adhesive layer has a thickness of approximately 0 to 25 μm. In other words, even if the ultra-thin broadband retardation film 100 includes the adhesive layer, the ultra-thin broadband retardation film 100 is still thinner than the prior retardation film having a thickness of approximately 50 μm or above and thereby satisfies the slimness requirement.

The ultra-thin broadband retardation film 100 may function as a quarter-wave plate. For instance, as described above, when the first retardation film 102 has an in-plane retardation value Ro of 130 nm, the second retardation film 104 has an in-plane retardation value Ro of 260 nm, and the angle between the optic axis of the first retardation film 102 and the optic axis of the second retardation film 104 is 58°, the ultra-thin broadband retardation film 100 functions as a quarter-wave plate.

Accordingly, the ultra-thin broadband retardation film 100 may be used along with a polarizing plate to convert a linear polarized light passing through an optical element to a circular polarized light; or, vice versa, to convert a circularly polarized light passing through the optical element to a linear polarized light. In detail, the ultra-thin broadband retardation film 100 is formed by laminating the polarizing plate on the second retardation film 104. In other words, the first retardation film 102 and the polarizing plate are on two opposite sides of the second retardation film 104. The polarizing plate may be any polarizing plate commonly known to persons with ordinary skill in the art, which includes, for example, a polarizer and two protective films on two sides of the polarizer.

Furthermore, the optical element of the invention formed by the ultra-thin broadband retardation film 100 and a polarizing plate or polarizer may be applied to an organic light-emitting diode display to solve the problem of the reflection of natural light from the environment. However, the optical element of the invention may be applied in other ways in addition to being used to replace a prior optical element; in other words, the optical element of the invention may adopt a prior structure and configuration. According to an embodiment of the invention, the optical element of the invention formed by the ultra-thin broadband retardation film 100 and the polarizing plate has a reflectance of 0%-10% within the visible light wavelength ranges (approximately 380 nm to 780 nm), wherein the first retardation film 102 included in the ultra-thin broadband retardation film 100 has an in-plane retardation value Ro of 130 nm, the second retardation film 104 included in the ultra-thin broadband retardation film 100 has an in-plane retardation value Ro of 260 nm, and the angle between the optic axis of the first retardation film 102 and the optic axis of the second retardation film 104 is 58°. The polarizing plate is produced by Optimax Company. In other words, the optical element including the ultra-thin broadband retardation film 100 has an excellent effect on antireflection.

As mentioned above, since the optic axis direction of the liquid crystal material may be easily adjusted by performing the alignment treatment or by material property (i.e. the rod-like liquid crystal doped with the chiral molecule), the ultra-thin broadband retardation film 100 could be produced and be laminated on the polarizing plate or polarizer by roll-to-roll process.

However, the optical element of the invention is not necessarily applied to an organic light-emitting diode display and may also be applied to, for example, a plasma display panel (PDP), a field emission display (FED), and other self luminous displays; or a non-self-luminous display such as a liquid-crystal display; or 3D glasses. Similarly, the optical element of the invention may be applied in other ways in addition to being used to replace a prior optical element; in other words, the optical element of the invention may adopt a prior structure and configuration.

In addition to being used along with the polarizing plate or polarizer, the ultra-thin broadband retardation film 100 may also be used along with a brightness enhancement film. In detail, an optical element of the invention formed by the ultra-thin broadband retardation film 100 and the brightness enhancement film may be applied to a backlight module to increase light utilization efficiency and to solve the problem of color shift in a large viewing angle. Similarly, the optical element of the invention may be applied in other ways in addition to being used to replace a prior optical element. In other words, the ultra-thin broadband retardation film 100 is disposed on a light emitting face of the brightness enhancement film.

Since the ultra-thin broadband retardation film 100 has a very small thickness (greater than 0 μm and less than or equal to 5 μm) when the ultra-thin broadband retardation film 100 is applied to practice, the ultra-thin broadband retardation film 100 may be disposed on a low-retardation film adapted as a support substrate. The low-retardation film has a high transmittance and an in-plane retardation value of approximately 30 nm or less, preferably 10 nm or less, and a material of the low-retardation film is not particularly limited and includes, for example, a triacetate cellulose (TAC), a polymethylmethacrylate (PMMA), a polycarbonate (PC), a cyclic olefin polymer (COP), and a polyvinylidene difluoride (PVDF).

In sum of the above, in the ultra-thin broadband retardation film according to the invention, as the in-plane retardation value Ro of the first retardation film is between 70 nm and 130 nm, the in-plane retardation value Ro of the second retardation film is between 140 nm and 260 nm, and the angle between the optic axis of the first retardation film and the optic axis of the second retardation film is between 35° and 70°, the ultra-thin broadband retardation film has a negative wavelength dispersion property. In addition, the ultra-thin broadband retardation film of the invention may be applied to any prior device or structure in place of the prior retardation film.

It will be apparent to those skilled in the art that various modifications and variations can be made to the disclosed embodiments without departing from the scope or spirit of this invention. In view of the foregoing, it is intended that the invention covers modifications and variations provided that they fall within the scope of the following claims and their equivalents.

What is claimed is:

1. An ultra-thin broadband retardation film, comprising:
   a first retardation film; and
   a second retardation film, disposed on a side of the first retardation film, wherein an in-plane retardation value Ro of the first retardation film is between 70 nm and 130 nm, an in-plane retardation value Ro of the second retardation film is between 140 nm and 260 nm second retardation film at a wavelength, a ratio of the in-plane retardation value Ro of the first retardation film to the in-plane retardation value Ro of the second retardation film at a wavelength of 550 nm is 0.5, and an angle between an optic axis of the first retardation film and an optic axis of the second retardation film is between 35° and 70°,
   wherein a material of the first retardation film and a material of the second retardation film respectively comprise a rod-like liquid crystal doped with a chiral molecule, wherein the chiral molecule is added by 0.01-3% of a solid content,
   wherein the first retardation film and the second retardation film respectively have a thickness of greater than 0 μm and less than or equal to 5 μm.

2. The ultra-thin broadband retardation film according to claim 1, further comprising an adhesive layer, disposed between the first retardation film and the second retardation film.

* * * * *